(12) United States Patent
Liu

(10) Patent No.: US 11,476,758 B2
(45) Date of Patent: Oct. 18, 2022

(54) SWITCH MODE POWER SUPPLY

(71) Applicant: AdvanOrigin Co., Ltd., Hsinchu (TW)

(72) Inventor: Te-Hua Liu, Hsinchu (TW)

(73) Assignee: AdvanOrigin Co., Ltd., Hsinchu (TW)

( * ) Notice: Subject to any disclaimer, the term of this patent is extended or adjusted under 35 U.S.C. 154(b) by 0 days.

(21) Appl. No.: 17/396,662

(22) Filed: Aug. 7, 2021

(65) Prior Publication Data
US 2022/0302834 A1 Sep. 22, 2022

(30) Foreign Application Priority Data
Mar. 19, 2021 (TW) .................................. 110109933

(51) Int. Cl.
| | |
|---|---|
| *H02M 3/157* | (2006.01) |
| *H03K 7/08* | (2006.01) |
| *H02M 3/335* | (2006.01) |
| *H02M 1/00* | (2006.01) |

(52) U.S. Cl.
CPC ......... *H02M 3/157* (2013.01); *H02M 1/0003* (2021.05); *H02M 3/33507* (2013.01); *H03K 7/08* (2013.01)

(58) Field of Classification Search
None
See application file for complete search history.

(56) References Cited

U.S. PATENT DOCUMENTS

| | | | |
|---|---|---|---|
| 7,705,483 B2* | 4/2010 | Ozawa ................... | H02M 3/156 307/31 |
| 8,648,639 B2* | 2/2014 | Lee ........................ | H02M 3/156 327/175 |
| 10,298,117 B2* | 5/2019 | Krishnamurthy ..... | H02M 3/158 |
| 2005/0088160 A1* | 4/2005 | Tanaka ................... | H02M 3/158 323/284 |

* cited by examiner

*Primary Examiner* — Jeffrey A Gblende
(74) *Attorney, Agent, or Firm* — Hammer & Associates, P.C.

(57) ABSTRACT

A switch mode power supply includes a PWM controller, a voltage converter, an output detector and a communicator. The PWM controller is to receive an actuation signal, and generates a PWM signal based on the actuation signal. The voltage converter is to receive the PWM signal and an external voltage, and converts, based on the PWM signal, the external voltage into first and second output voltages. The output detector is to receive the first and second output voltages, and generates an enable signal based on a target voltage value and a magnitude difference between the first and second output voltages. The communicator is to receive the enable signal, and generates the actuation signal corresponding to the enable signal.

13 Claims, 6 Drawing Sheets

SWITCH MODE POWER SUPPLY

CROSS-REFERENCE TO RELATED APPLICATION

This application claims priority of Taiwanese Patent Application No. 110109933, filed on Mar. 19, 2021.

FIELD

The disclosure relates to a power supply, and more particularly to a switch mode power supply without a gate drive transformer.

BACKGROUND

FIG. 1 illustrates a conventional switch mode power supply that provides an output voltage having a magnitude adjustable within a range of from 0V to 30V. The conventional switch mode power supply directly adjusts the magnitude of the output voltage to a target voltage value, and includes three controllers (i.e., a power controller 11, a pulse width modulation (PWM) controller 13 and an output controller 18), three transformers (i.e., a power transformer 12, a gate drive transformer 14 and an output transformer 17), two switches (i.e., a first switch 15 and a second switch 16) and other elements.

Disadvantageously, the gate drive transformer 14 consumes a large amount of power during voltage conversion. In addition, a PWM signal provided by the PWM controller 13 would distort (i.e., a duty cycle, a rise time and a fall time of the PWM signal would become less ideal) after being processed by the gate drive transformer 14, thereby increasing power consumption of the second switch 16.

SUMMARY

Therefore, an object of the disclosure is to provide a switch mode power supply that can alleviate the drawbacks of the prior art.

According to the disclosure, the switch mode power supply includes a pulse width modulation (PWM) controller, a voltage converter, an output detector and a communicator. The PWM controller is to receive an actuation signal, and generates a PWM signal based on the actuation signal. The voltage converter has a first output terminal and a second output terminal, is coupled to the PWM controller to receive the PWM signal, and is to further receive an external voltage. Based on the PWM signal, the voltage converter converts the external voltage into a first output voltage, which is outputted at the first output terminal thereof, and a second output voltage, which is outputted at the second output terminal thereof. The output detector is coupled to the first and second output terminals of the voltage converter to receive the first and second output voltages, and generates an enable signal based on a target voltage value and a magnitude difference between the first and second output voltages. The communicator is coupled to the output detector to receive the enable signal, is further coupled to the PWM controller, and generates the actuation signal, which corresponds to the enable signal, for receipt by the PWM controller.

BRIEF DESCRIPTION OF THE DRAWINGS

Other features and advantages of the disclosure will become apparent in the following detailed description of the embodiments with reference to the accompanying drawings, of which.

DETAILED DESCRIPTION

Figure 1:
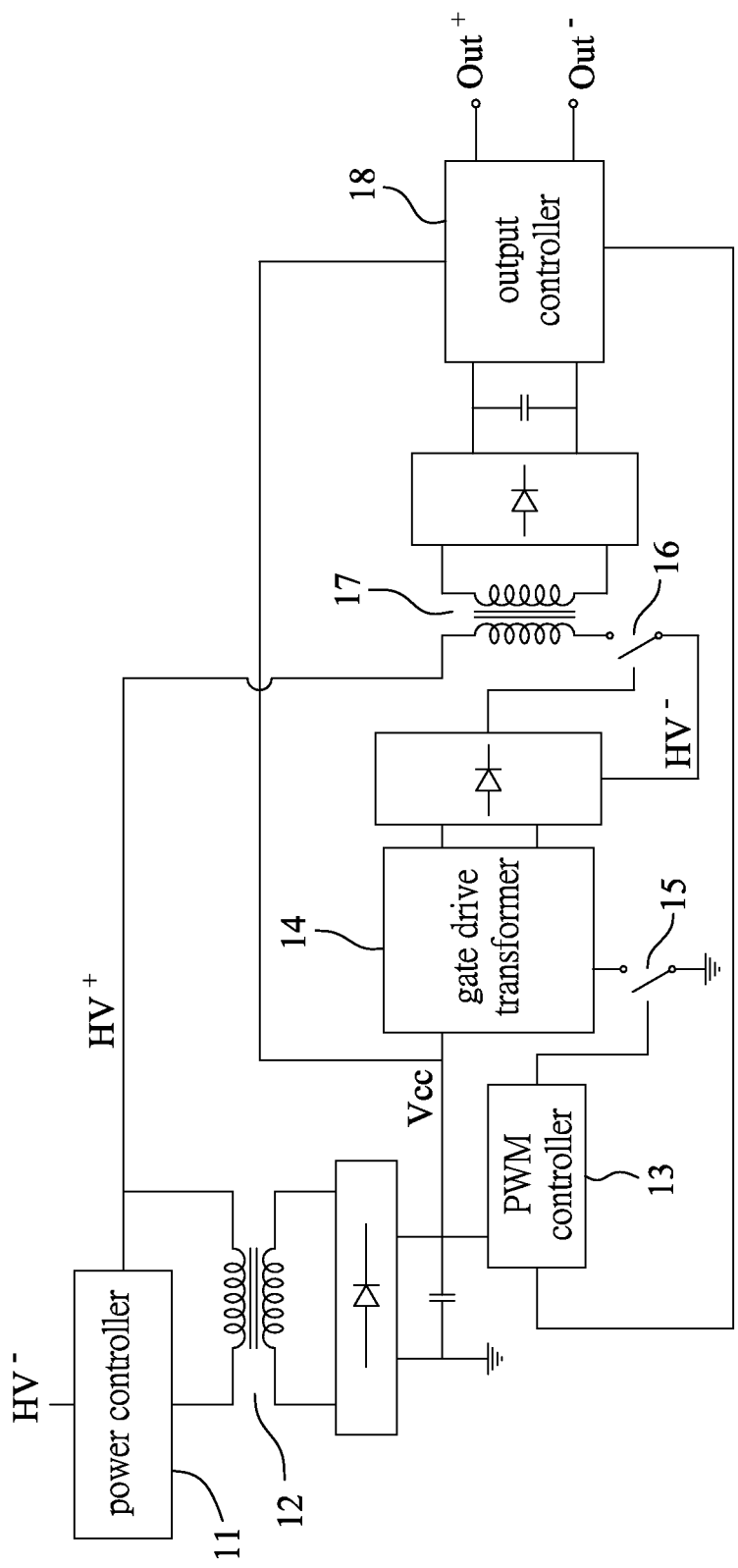
FIG. 1 is a circuit block diagram illustrating a conventional switch mode power supply.

Before the disclosure is described in greater detail, it should be noted that where considered appropriate, reference numerals or terminal portions of reference numerals have been repeated among the figures to indicate corresponding or analogous elements, which may optionally have similar characteristics.

Referring to FIGS. 2 to 5, a first embodiment of a switch mode power supply according to the disclosure includes a voltage converter 2, an output detector 3, a first pulse width modulation (PWM) controller 4, a communicating unit (communicator) 5, a discharger 6, a voltage generator 91, a display 10 and an input device 80.

The voltage converter 2 has a first output terminal (Out$^+$) and a second output terminal (Out$^-$), and is to receive an external voltage (HV$^+$) and a first PWM signal (PWM1). Based on the first PWM signal (PWM1), the voltage converter 2 converts the external voltage (HV$^+$) into a first output voltage (Va), which is outputted at the first output terminal (Out$^+$) thereof, and a second output voltage (Vb), which is outputted at the second output terminal (Out$^-$) thereof.

In this embodiment, the voltage converter 2 includes a transformer (T1), two switches (Q1, Sout), a rectifier (REC3), a clamper 21, two capacitors (C6, Cout) and an adjustable resistive element 7.

The transformer (T1) has a first winding (T1P1) and a second winding (T1S1). Each of the first and second windings (T1P1, T1S1) has a first terminal and a second terminal. The first terminal of the first winding (T1P1) is to receive the external voltage (HV$^+$)

The switch (Q1) (e.g., an N-type metal oxide semiconductor field effect transistor (nMOSFET)) has a first terminal (e.g., a drain terminal) that is coupled to the second terminal of the first winding (T1P1) of the transformer (T1), a second terminal (e.g., a source terminal) that is coupled to ground, and a control terminal (e.g., a gate terminal) that is to receive the first PWM signal (PWM1). The switch (Q1) transitions between conduction and non-conduction based on the first PWM signal (PWM1) to cause the transformer (T1) to convert the external voltage (HV$^+$) into a voltage across the second winding (T1S1) of the transformer (T1).

The clamper 21 is coupled between the first and second terminals of the first winding (T1P1) of the transformer (T1), and fixes a peak magnitude of a voltage at the second terminal of the first winding (T1P1) of the transformer (T1) to a predetermined voltage value.

The rectifier (REC3) has two input terminals that are respectively coupled to the first and second terminals of the second winding (T1S1) of the transformer (T1), and two output terminals that are respectively coupled to the first output terminal (Out$^+$) of the voltage converter 2 and ground. The rectifier (REC3) rectifies the voltage across the second winding (T1S1) of the transformer (T1) to generate the first output voltage (Va) at the first output terminal (Out$^+$) of the voltage converter 2.

The capacitor (C6) is coupled between the first output terminal (Out⁺) of the voltage converter 2 and ground, and stabilizes the first output voltage (Va).

The capacitor (Cout) and the switch (Sout) are coupled in series between the first and second output terminals (Out⁺, Out⁻) of the voltage converter 2. The switch (Sout) can be turned on manually or automatically when necessary (e.g., when a converter output current provided by the voltage converter 2 through the first and second output terminals (Out⁺, Out⁻) thereof is large). The switch (Sout) may be a mechanical switch (e.g., a slide switch) or an electronic switch (e.g., a metal oxide semiconductor field effect transistor (MOSFET), an insulated gate bipolar transistor (IGBT) or a relay). When the switch (Sout) is turned on, the capacitor (Cout) stabilizes a converter output voltage provided between the first and second output terminals (Out⁺, Out⁻) of the voltage converter 2.

The adjustable resistive element 7 is coupled between the second output terminal (Out⁻) of the voltage converter 2 and ground, and is to receive a resistance adjustment output that includes a plurality of resistance adjustment signals (e.g., the resistance adjustment output (Rs[7:0]) including eight resistance adjustment signals (Rs[0]-Rs[7])). The adjustable resistive element 7 provides, between the second output terminal (Out⁻) of the voltage converter 2 and ground, a resistance that is dependent on the resistance adjustment output (Rs[7:0]). The converter output current flows through the adjustable resistive element 7, so the second output voltage (Vb) has a magnitude that is equal to a product of a magnitude of the converter output current and the resistance provided by the adjustable resistive element 7. The magnitude of the second output voltage (Vb) is to be confined within a range of from 0.02V to 0.2V. In this embodiment, the adjustable resistive element 7 includes a plurality of resistive units 71 (e.g., eight resistive units 71). One of the resistive units 71 includes a switch (Sa0) that is coupled between the second output terminal (Out⁻) of the voltage converter 2 and ground. Each of remaining ones of the resistive units 71 includes a resistor (Ra1/Ra2/Ra3/Ra4/Ra5/Ra6/Ra7) and a switch (Sa1/Sa2/Sa3/Sa4/Sa5/Sa6/Sa7) that are coupled in series between the second output terminal (Out⁻) of the voltage converter 2 and ground. Each of the switches (Sa0-Sa7) of the resistive units 71 is to receive a respective one of the resistance adjustment signals (Rs[0]-Rs[7]), and transitions between conduction and non-conduction based on the respective one of the resistance adjustment signals (Rs[0]-Rs[7]). Each of the switches (Sa0-Sa7) may be one having a model name of 2N7002, S12306 or RD3G500GN. The resistors (Ra1-Ra7) of the remaining ones of the resistive units 71 may have different resistances. When the converter output current is greater than 1A in magnitude, a conduction resistance of each of the switches (Sa0-Sa7) should be taken into consideration since a voltage across the switch may be greater than 0.02V in magnitude. When the converter output current is greater than 1 mA in magnitude, the conduction resistance of each of the switches (Sa0-Sa7) should be small to reduce a magnitude of the voltage across the switch. When the converter output current is smaller than 1 mA in magnitude, each of the switches (Sa0-Sa7) may be a transistor operating based on a small signal (e.g., one having a model name of 2N7002) to reduce a cost and a volume of the switch mode power supply of this embodiment.

The output detector 3 is coupled to the first and second output terminals (Out⁺, Out⁻) of the voltage converter 2 to receive the first and second output voltages (Va, Vb), and is further coupled to the adjustable resistive element 7. The output detector 3 generates an enable signal based on a target voltage value and a magnitude difference between the first and second output voltages (Va, Vb), generates an indication signal that indicates the target voltage value and a maximum current value, and generates the resistance adjustment output (Rs[7:0]) for receipt by the adjustable resistive element 7 based on the second output voltage (Vb).

In this embodiment, the output detector 3 includes a voltage detection circuit 31, a current detection circuit 32 and a microcontroller 33.

The voltage detection circuit 31 is coupled to the first output terminal (Out⁺) of the voltage converter 2 to receive the first output voltage (Va), and generates a first detection signal ($V_{IN}$) that corresponds to the first output voltage (Va). In this embodiment, the voltage detection circuit 31 includes three resistors (R4-R6), two switches (Q4, Q5), an amplifier (OP1) and a capacitor (C7). The resistor (R4) has a first terminal that is coupled to the first output terminal (Out⁺) of the voltage converter 2 to receive the first output voltage (Va), and a second terminal. The resistor (R5) and the switch (Q4) are coupled in series between the second terminal of the resistor (R4) and ground. The switch (Q4) is to receive a first switch control signal (V10), and transitions between conduction and non-conduction based on the first switch control signal (V10). The resistor (R6) and the switch (Q5) are coupled in series between the second terminal of the resistor (R4) and ground. The switch (Q5) is to receive a second switch control signal (V4), and transitions between conduction and non-conduction based on the second switch control signal (V4). The amplifier (OP1) has a non-inverting input terminal that is coupled to the second terminal of the resistor (R4), an inverting input terminal, and an output terminal that is coupled to the inverting input terminal of the amplifier (OP1) and that provides the first detection signal ($V_{IN}$). The capacitor (C7) is coupled between the output terminal of the amplifier (OP1) and ground.

In this embodiment, the amplifier (OP1) is one having a model name of LM358; a magnitude of the converter output voltage, which is equal to the magnitude difference between the first and second output voltages (Va, Vb), is adjustable within a range of from 0V to 30V; the magnitude of the second output voltage (Vb) is to be confined within the range of from 0.02V to 0.2V, and resistances of the resistors (R4-R6) are respectively 9KΩ, 1KΩ and 3KΩ. Therefore, the first detection signal (VIN) has a voltage that is equal to the first output voltage (Va) in magnitude when none of the switches (Q4, Q5) conducts, that is equal to one-fourth the first output voltage (Va) in magnitude when the switch (Q5) conducts while the switch (Q4) does not conduct, and that is equal to one-tenth the first output voltage (Va) in magnitude when the switch (Q4) conducts while the switch (Q5) does not conduct; and the switches (Q4, Q5) can be controlled in such a way that the voltage of the first detection signal ($V_{IN}$) does not exceed 3.5V in magnitude.

The current detection circuit 32 is coupled to the second output terminal (Out⁻) of the voltage converter 2 to receive the second output voltage (Vb), and generates a second detection signal ($I_{IN}$) that corresponds to the second output voltage (Vb). In this embodiment, the current detection circuit 32 includes an amplifier (OP2), two resistors (R7, R8) and a capacitor (C8). The amplifier (OP2) has a non-inverting input terminal that is coupled to the second output terminal (Out⁻) of the voltage converter 2 to receive the second output voltage (Vb), an inverting input terminal, and an output terminal that provides the second detection signal ($I_{IN}$). The resistor (R7) is coupled between the inverting input terminal of the amplifier (OP2) and ground. The resistor (R8) is coupled between the inverting input terminal and the output terminal of the amplifier (OP2). The capacitor (C8) is coupled between the output terminal of the amplifier (OP2) and ground. Therefore, the first detection signal ($V_{IN}$) has a voltage that is equal to vb×(1+r8/r7) in magnitude, where "vb" denotes the magnitude of the second output voltage (Vb), "r7" denotes a resistance of the resistor (R7), "r8" denotes a resistance of the resistor (R8), and 1+r8/r7=15 in this embodiment.

The microcontroller 33 is coupled to the output terminals of the amplifiers (OP1, OP2) to receive the first and second detection signals ($V_{IN}$, $I_{IN}$), and is further coupled to the switches (Q4, Q5) and the adjustable resistive element 7. The microcontroller 33 generates the first and second switch control signals (V10, V4) for receipt by the switches (Q4, Q5) based on the first detection signal ($V_{IN}$), such that the voltage of the first detection signal ($V_{IN}$) does not exceed 3.5V in magnitude. The microcontroller 33 generates the resistance adjustment output (Rs[7:0]) for receipt by the adjustable resistive element 7 based on the second detection signal ($I_{IN}$), such that the magnitude of the second output voltage (Vb) is confined within the range of from 0.02V to 0.2V (i.e., the magnitude of the voltage of the second detection signal ($I_{IN}$) being confined within a range of from 0.3V to 3V). To be specific, when the voltage of the second detection signal ($I_{IN}$) is smaller than 0.3V in magnitude, the microcontroller 33 generates the resistance adjustment output (Rs[7:0]) in such a way that the resistance provided by the adjustable resistive element 7 is increased; and when the voltage of the second detection signal ($I_{IN}$) is greater than 3V in magnitude, the microcontroller 33 generates the resistance adjustment output (Rs[7:0]) in such a way that the resistance provided by the adjustable resistive element 7 is decreased. It should be noted that: in this embodiment, the microcontroller 33 directly generates the eight resistance adjustment signals (Rs[0]-Rs[7]) to respectively control the switches (Sa0-Sa7) of the adjustable resistive element 7; but in other embodiments, the microcontroller 33 may be coupled to the adjustable resistive element 7 through a three-to-eight decoder (e.g., one having a model name of 74HC238) (not shown), and may generate three signals that are to be decoded by the three-to-eight decoder into the eight resistance adjustment signals (Rs[0]-Rs[7]) to respectively control the switches (Sa0-Sa7) of the adjustable resistive element 7.

The microcontroller 33 obtains a magnitude of the first output voltage (Va) based on the first detection signal ($V_{IN}$) and the first and second switch control signals (V10, V4), obtains the magnitude of the second output voltage (Vb) based on the second detection signal (IN), obtains the magnitude of the converter output current based on the magnitude of the second output voltage (Vb) and the resistance adjustment output (Rs[7:0]), and obtains the magnitude difference between the first and second output voltages (Va, Vb) based on the magnitude of the first output voltage (Va) and the magnitude of the second output voltage (Vb). The microcontroller 33 generates the enable signal based on the target voltage value and the magnitude difference between the first and second output voltages (Va, Vb), and generates the indication signal. The enable signal is at one of a logic "0" level and a logic "1" level when the magnitude difference between the first and second output voltages (Va, Vb) is greater than the target voltage value, and is at the other one of the logic "0" level and the logic "1" level otherwise. In this embodiment, the microcontroller 33 operates in the digital domain, obtains digital values of the magnitudes of the voltages of the first and second detection signals ($V_{IN}$, $I_{IN}$) based on a reference voltage, and obtains digitals values of the magnitudes of the first and second output voltages (Va, Vb) and the magnitude difference between the first and second output voltages (Va, Vb) based on the digital values of the magnitudes of the voltages of the first and second detection signals ($V_{IN}$, $I_{IN}$). In an example, the digital values of the magnitudes of the voltages of the first and second detection signals ($V_{IN}$, $I_{IN}$) are respectively 1023×vin/vref and 1023×iin/vref, where "vin" denotes the magnitude of the voltage of the first detection signal (VIN), "iin" denotes the magnitude of the voltage of the second detection signal ($I_{IN}$), and "vref" denotes a magnitude of the reference voltage (e.g., 4.096V).

Figure 2:
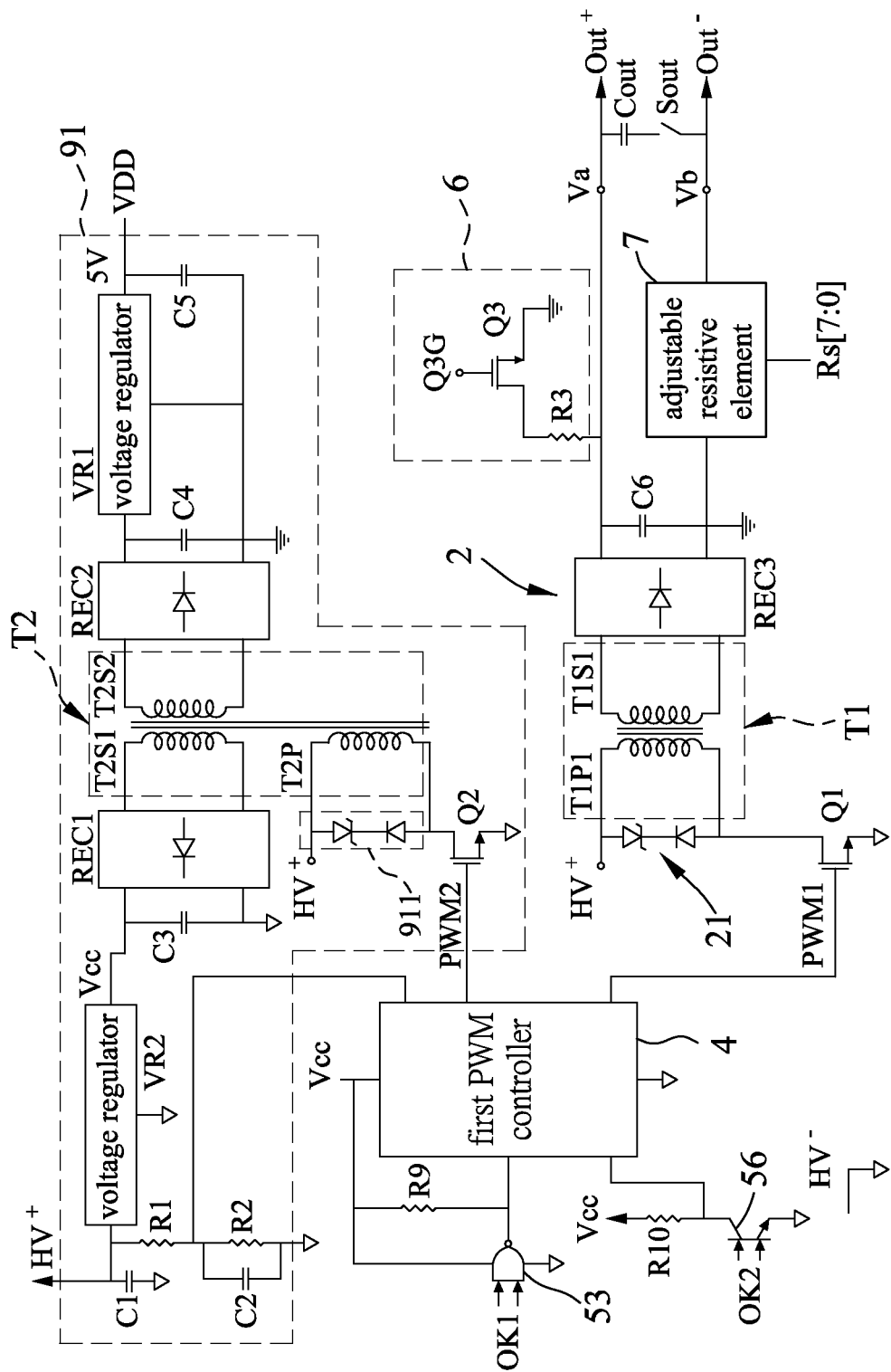
FIGS. 2 to 5 are circuit block diagrams illustrating a first embodiment of a switch mode power supply according to the disclosure.
Figure 3:
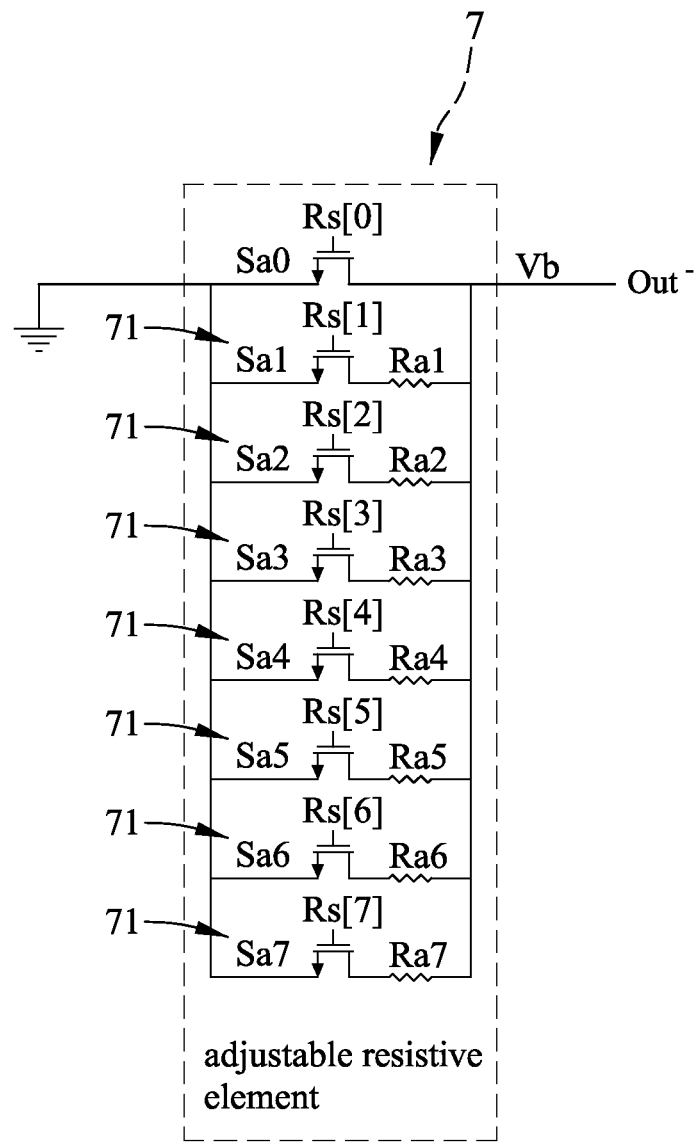
Figure 4:
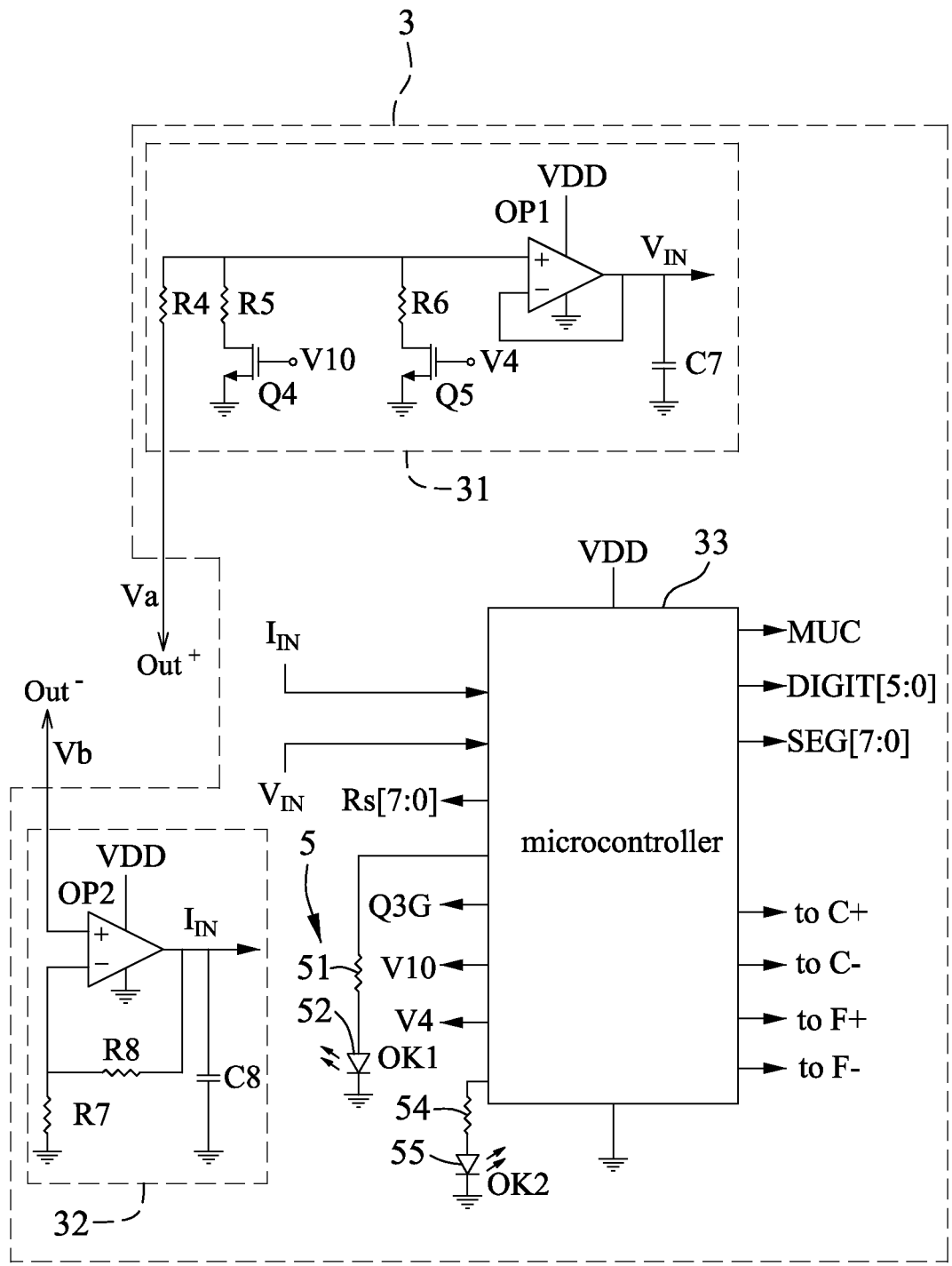
Figure 5:
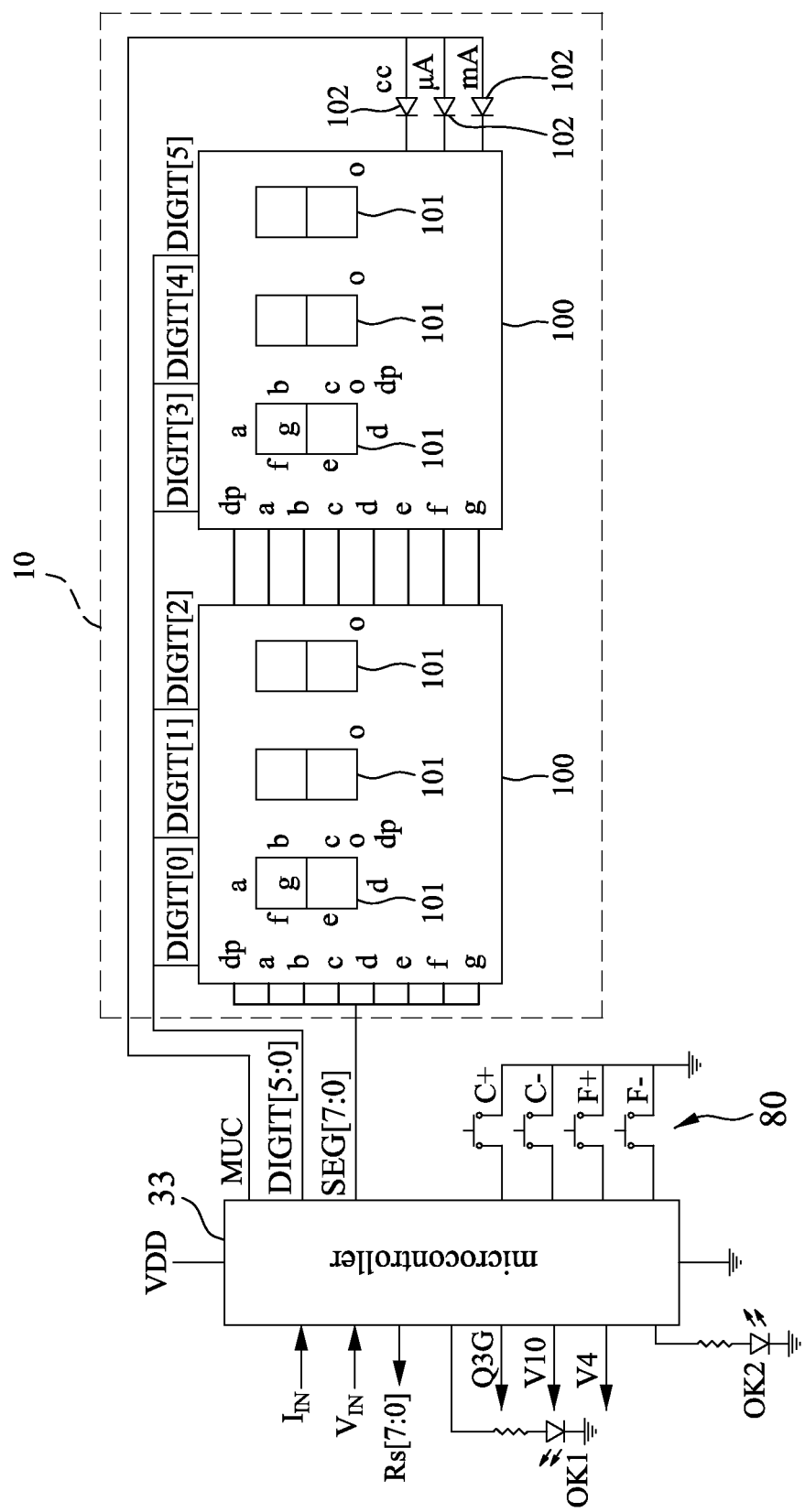
Figure 6:
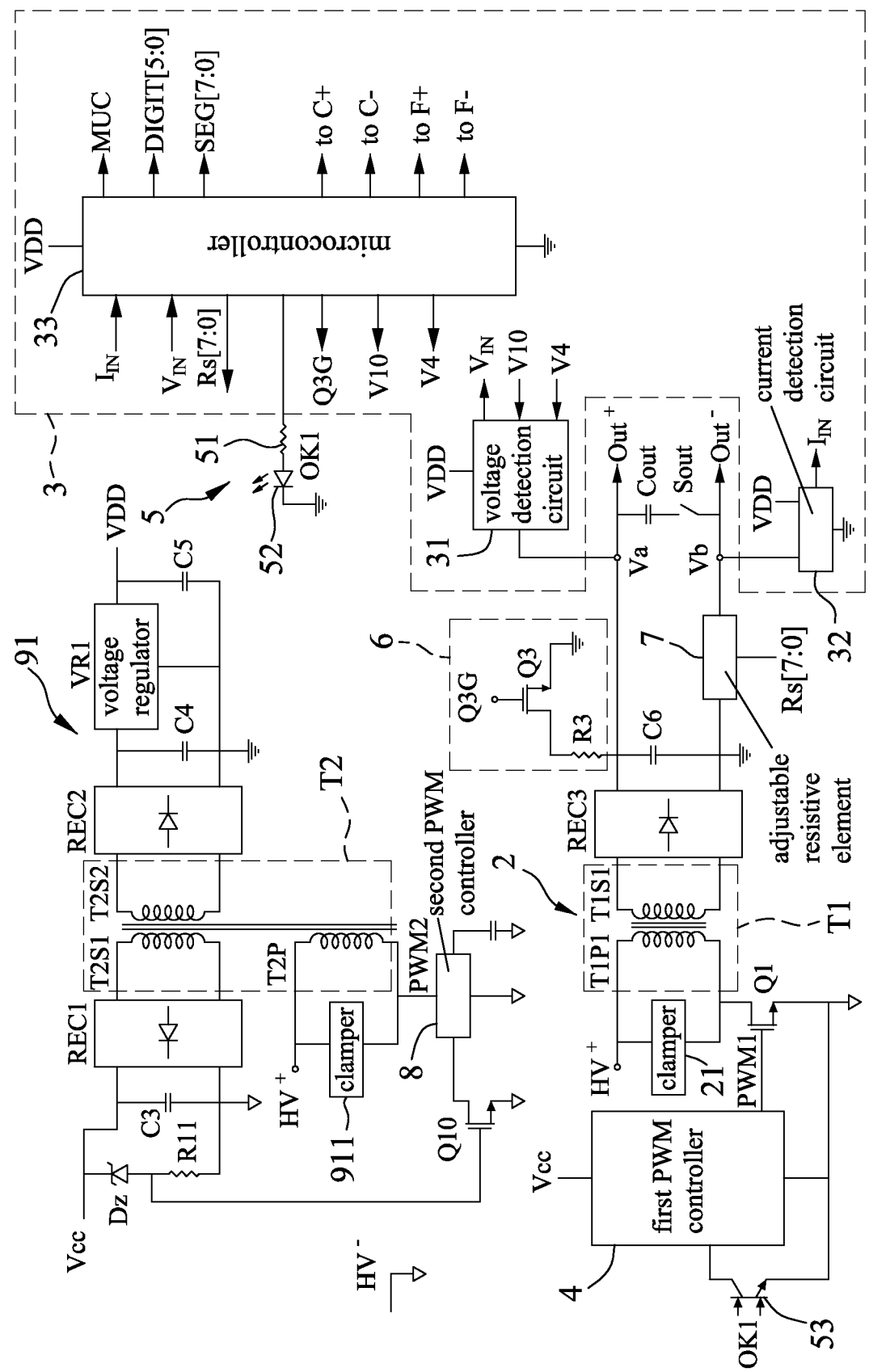
FIG. 6 is a circuit block diagram illustrating a second embodiment of the switch mode power supply according to the disclosure.

The communicator 5 is coupled to the microcontroller 33 to receive the enable signal and the indication signal, and generates an actuation signal corresponding to the enable signal and a communication signal corresponding to the indication signal. In this embodiment, the communicator 5 includes four resistors (51, 54, R9, R10) and two opto-isolators (OK1, OK2). Each of the opto-isolators (OK1, OK2) includes a light emitting diode 52/55 and a photosensor 53/56. The resistor 51 and the light emitting diode 52 are coupled in series between the microcontroller 33 and ground. The light emitting diode 52 is to receive the enable signal from the microcontroller 33, and converts the enable signal into a first light signal. The photosensor 53 is coupled to the resistor (R9), detects the first light signal, and cooperates with the resistor (R9) to generate, at a common node of the photosensor 53 and the resistor (R9), the actuation signal corresponding to the first light signal. The resistor 54 and the light emitting diode 55 are coupled in series between the microcontroller 33 and ground. The light emitting diode 55 is to receive the indication signal from the microcontroller 33, and converts the indication signal into a second light signal. The photosensor 56 is coupled to the resistor (R10), detects the second light signal, and cooperates with the resistor (R10) to generate, at a common node of the photosensor 56 and the resistor (R10), the communication signal corresponding to the second light signal. To be specific, the actuation signal is complementary to the enable signal, the communication signal is complementary to the indication signal, and data bits of the target voltage value and the maximum current value are transmitted serially using data framing of a universal asynchronous receiver-transmitter (UART). When the target voltage value and the maximum current value are not transmitted, the indication signal is at a logic "0" level, the light emitting diode 55 does not emit light, and the communication signal is at a logic "1" level. Therefore, the light emitting diode 55 can have a long lifetime. The opto-isolator (OK1) may be a high speed photodiode opto-isolator (e.g., one having a model name of VOH1016A) as shown in FIGS. 2 and 4, or may be a low speed phototransistor opto-isolator (e.g., one having a mode name of PC817) as shown in FIG. 6.

The first PWM controller 4 is coupled to the common node of the photosensor 53 and the resistor (R9) and the common node of the photosensor 56 and the resistor (R10) to receive the actuation signal and the communication signal, is further coupled to the control terminal of the switch (Q1), and generates the first PWM signal (PWM1) for receipt by the control terminal of the switch (Q1) based on the actuation signal and the communication signal. In this embodiment, the first PWM signal (PWM1) transitions between two different logic levels (i.e., a logic "0" level and a logic "1" level) with a duty cycle in an ON time interval (i.e., when the logic level of the actuation signal corresponds to that the magnitude difference between the first and second output voltages (Va, Vb) is not greater than the target voltage value), and does not transition between the two different logic levels (e.g., staying at the logic "0" level) in an OFF time interval (i.e., when the logic level of the actuation signal corresponds to that the magnitude difference between the first and second output voltages (Va, Vb) is greater than the target voltage value), so as to stabilize the magnitude of the converter output voltage at the target voltage value. The first PWM controller 4 obtains a ripple control time based on the target voltage value and the maximum current value as indicated by the communication signal, and adjusts the duty cycle of the first PWM signal (PWM1) based on the ripple control time, a length of the ON time interval and a length of the OFF time interval. When the length of the ON time interval is longer than the ripple control time (i.e., output power of the transformer (T1) being insufficient), the first PWM controller 4 increases the duty cycle of the first PWM signal (PWM1). When the length of the OFF time interval is longer than a number (N) multiplied by the ripple control time, the first PWM controller 4 decreases the duty cycle of the first PWM signal (PWM1), where N>1 (e.g., N=5). Optionally, when the length of the OFF time interval is shorter than a number (M) multiplied by the ripple control time, the first PWM controller 4 increases the duty cycle of the first PWM signal (PWM1), so as to prevent the output power of the transformer (T1) from being insufficient, where M<1 (e.g., M=0.1). To be specific, the ripple control time is equal to C×Vo×r/Io, where "C" denotes a capacitance of the capacitor (C6), "Vo" denotes the target voltage value, "r" denotes a predetermined allowable temporary voltage drop ratio (e.g., 0.1), and "Io" denotes the maximum current value. This reflects the worst condition where the magnitude of the converter output current abruptly changes from zero to the maximum current value. As a consequence, when the voltage converter 2 has lighter loading, the duty cycle of the first PWM signal (PWM1) is decreased, thereby reducing the output power of the transformer (T1) and a magnitude of ripple components of the converter output voltage; and when the voltage converter 2 has heavier loading, the duty cycle of the first PWM signal (PWM1) is increased, thereby increasing the output power of the transformer (T1) and preventing magnitude drop of the converter output voltage.

It should be noted that: in this embodiment, the switch (Q1) is directly driven by the first PWM controller 4 through the first PWM signal (PWM1); but the first PWM signal (PWM1) generated by the first PWM controller 4 in other embodiments may be complementary to the first PWM signal (PWM1) generated by the first PWM controller 4 in this embodiment, and an inverter (not shown) may be inserted between the first PWM controller 4 and the control terminal of the switch (Q1) in other embodiments to invert the first PWM signal (PWM1) into a signal that has increased driving capability and that is to drive the switch (Q1).

The discharger 6 is coupled to the first output terminal (Out$^+$) of the voltage converter 2, is to receive a discharge control signal (Q3G), and is operable, based on the discharge control signal (Q3G), to reduce or not to reduce the magnitude of the converter output voltage. In this embodiment, the discharger 6 includes a resistor (R3) and a switch (Q3) that are coupled in series between the first output terminal (Out$^+$) of the voltage converter 2 and ground. The switch (Q3) is to receive the discharge control signal (Q3G), and transitions between conduction and non-conduction based on the discharge control signal (Q3G). The magnitude of the converter output voltage is reduced when the switch (Q3) conducts, and is not reduced when the switch (Q3) does not conduct.

The microcontroller 33 is further coupled to the switch (Q3), and generates the discharge control signal (Q3G) for receipt by the switch (Q3) based on the target voltage value and the magnitude difference between the first and second output voltages (Va, Vb). The discharge control signal (Q3G) is generated in such a way that, when the magnitude difference between the first and second output voltages (Va, Vb) is greater than the target voltage value by a predetermined threshold (i.e., the magnitude of the converter output voltage being too large), the switch (Q3) conducts for a while to let the capacitor (C6) be discharged, and to further let the capacitor (Cout) be discharged if the switch (Sout) conducts. As a consequence, the magnitude of the converter output voltage can be quickly reduced to the target voltage value.

The voltage generator 91 is coupled to the output detector 3 and the first PWM controller 4, and is to receive a second PWM signal (PWM2) and the external voltage (HV$^+$). Based on the second PWM signal (PWM2), the voltage generator 91 converts the external voltage (HV$^+$) into a first operation voltage (VDD), which is to power the output detector 3, and a second operation voltage (Vcc), which is to power the first PWM controller 4.

In this embodiment, the voltage generator 91 includes a transformer (T2), a switch (Q2), two rectifiers (REC1, REC2), five capacitors (C1-C5), two resistors (R1, R2), two voltage regulators (VR1, VR2) and a clamper 911.

The transformer (T2) includes a first winding (T2P), a second winding (T2S1) and a third winding (T2S2). Each of the first to third windings (T2P, T2S1, T2S2) has a first terminal and a second terminal. The first terminal of the first winding (T2P) is to receive the external voltage (HV$^+$).

The switch (Q2) (e.g., an nMOSFET) has a first terminal (e.g., a drain terminal) that is coupled to the second terminal of the first winding (T2P) of the transformer (T2), a second terminal (e.g., a source terminal) that is coupled to ground, and a control terminal (e.g., a gate terminal) that is to receive the second PWM signal (PWM2). The switch (Q2) transitions between conduction and non-conduction based on the second PWM signal (PWM2) to cause the transformer (T2) to convert the external voltage (HV$^+$) into a voltage across the second winding (T2S1) of the transformer (T2) and a voltage across the third winding (T2S2) of the transformer (T2).

The clamper 911 is coupled between the first and second terminals of the first winding (T2P) of the transformer (T2), and fixes a peak magnitude of a voltage at the second terminal of the first winding (T2P) of the transformer (T2) to a predetermined voltage value.

The rectifier (REC1) has two input terminals that are respectively coupled to the first and second terminals of the second winding (T2S1) of the transformer (T2), a first output terminal that is coupled to the first PWM controller 4, and a second output terminal that is coupled to ground. The rectifier (REC1) rectifies the voltage across the second winding (T2S1) of the transformer (T2) to generate the second operation voltage (Vcc) (e.g., 5.5V) at the first output terminal of the rectifier (REC1).

The capacitor (C3) is coupled between the first output terminal of the rectifier (REC1) and ground, and stabilizes of the second operation voltage (Vcc).

The capacitor (C1) has a first terminal that is to receive the external voltage (HV+), and a second terminal that is coupled to ground. The capacitor (C1) stabilizes of the external voltage (HV+).

The resistor (R1) has a first terminal that is coupled to the first terminal of the capacitor (C1) to receive the external voltage (HV+), and a second terminal.

The capacitor (C2) and the resistor (R2) are coupled in parallel between the second terminal of the resistor (R1) and ground.

The resistor (R2) cooperates with the resistor (R1) to form a voltage divider. The voltage divider divides the external voltage (HV+) to generate a divided voltage. The capacitor (C2) stores the divided voltage.

The voltage regulator (VR2) is coupled between the first terminal of the capacitor (C1) and the first output terminal of the rectifier (REC1). During power-up of the first PWM controller 4, the voltage regulator (VR2) converts the external voltage (HV+) into a voltage (e.g., 5V) at the first output terminal of the rectifier (REC1) to power the first PWM controller 4. Thereafter, when the rectifier (REC1) generates the second operation voltage (Vcc) that exceeds 5V in magnitude, the voltage regulator (VR2) stops the conversion, and the first PWM controller 4 is powered by the second operation voltage (Vcc).

The rectifier (REC2) has two input terminals that are respectively coupled to the first and second terminals of the third winding (T2S2) of the transformer (T2), a first output terminal, and a second output terminal that is coupled to ground. The rectifier (REC2) rectifies the voltage across the third winding (T2S2) of the transformer (T2) to generate a voltage (e.g., >7V) at the first output terminal of the rectifier (REC2).

The capacitor (C4) is coupled between the first output terminal of the rectifier (REC2) and ground, and stabilizes the voltage at the first output terminal of the rectifier (REC2).

The voltage regulator (VR1) is coupled between the first output terminal of the rectifier (REC2) and the output detector 3, and converts the voltage at the first output terminal of the rectifier (REC2) into the first operation voltage (VDD) (e.g., 5V) to power the output detector 3.

The capacitor (C5) is coupled between a common node of the voltage regulator (VR1) and the output detector 3 and ground, and stabilizes the first operation voltage (VDD).

The first PWM controller 4 is further coupled to the capacitor (C2) to receive the divided voltage, is further coupled to the control terminal of the switch (Q2), and generates the second PWM signal (PWM2) for receipt by the control terminal of the switch (Q2) based on the second operation voltage (Vcc) and the divided voltage to stabilize the magnitude of the second operation voltage (Vcc) at 5.5V. In this embodiment, the second PWM signal (PWM2) transitions between two different logic levels (i.e., a logic "0" level and a logic "1" level) with a duty cycle related to the second operation voltage (Vcc) and the divided voltage.

The display 10 includes two multiplexed multiple-digit seven-segment display devices 100, each of which has a plurality of seven-segment display elements 101 (e.g., three seven-segment display elements 101) with decimal point. The display 10 further includes a plurality of display elements 102 (e.g., three light emitting diodes), one of which is capable of displaying "cc" (i.e., the magnitude of the converter output current exceeding the maximum current value), and each of remaining ones of which is capable of displaying a respective base unit of electric current (e.g., "μA" or "mA"). It should be noted that, in other embodiments, the display 10 may be a dot-matrix display.

The microcontroller 33 is further coupled to the display 10, and generates a display output based on the magnitude difference between the first and second output voltages (Va, Vb) and the magnitude of the converter output current to control the display 10. In this embodiment, the display output includes a digit control output, a segment control output and a display control signal (MUC). The digit control output includes a plurality of digit control signals (e.g., the digit control output (DIGIT[5:0]) including six digit control signals (DIGIT[0]-DIGIT[5])) that are to be respectively received by the seven-segment display elements 101 of the multiplexed multiple-digit seven-segment display devices 100. The segment control output includes a plurality of segment control signals (e.g., the segment control output (SEG[7:0]) including eight digit control signals (SEG[0]-SEG[7])), which are to be received by each of the seven-segment display elements 101 of the multiplexed multiple-digit seven-segment display devices 100, and a plurality (e.g., three) of which are to be respectively received by the display elements 102. The display control signal (MUC) is to be received by each of the display elements 102. The microcontroller 33 controls the multiplexed multiple-digit seven-segment display devices 100 to respectively display a value of the magnitude difference between the first and second output voltages (Va, Vb) and a value of the magnitude of the converter output current. The microcontroller 33 controls said one of the display elements 102 to display "cc" (i.e., emitting light) when the magnitude of the converter output current exceeds the maximum current value, and to not display "cc" (i.e., not emitting light) otherwise. The microcontroller 33 controls, based on the magnitude of the converter output current, each of the remaining ones of the display elements 102 to transition between displaying and not displaying the respective base unit of electric current (i.e., transitioning between emitting light and not emitting light). Each of the remaining ones of the display elements 102 displays the respective base unit of electric current (i.e., emitting light) when the respective base unit of electric current corresponds to a base unit of the magnitude of the converter output current, and does not display the respective base unit of electric current (i.e., not emitting light) otherwise. When the display 10 is to display the value of the magnitude difference between the first and second output voltages (Va, Vb) and the value and the base unit of the magnitude of the converter output current, the display output is generated in such a way that the seven-segment display elements 101 of the multiplexed multiple-digit seven-segment display devices 100 and a combination of the display elements 102 display (emit light) one by one cyclically at a sufficiently high frequency, so it would be visually perceived by a person that the display 10 is continuously displaying the value of the magnitude difference between the first and second output voltages (Va, Vb) and the value and the base unit of the magnitude of the converter output current.

The input device 80 can be operated to input the target voltage value and the maximum current value. The microcontroller 33 is coupled to the input device 80, obtains the target voltage value and the maximum current value based on the operations performed on the input device 80, and stores the target voltage value and the maximum current value in a non-volatile memory (e.g., a flash memory) of the microcontroller 33 for later use. In this embodiment, the input device 80 includes four push buttons (C+, C−, F+, F−), where the push buttons (C+, C−) are used to adjust two most significant digits of each of the target voltage value and the maximum current value, and the push buttons (F+, F−) are used to adjust a least significant digit of each of the target voltage value and the maximum current value. When any one of the push buttons (C+, C−, F+, F−) is pressed, the microcontroller 33 generates the display output in such a way that a person can see that the display 10 displays the target voltage value in a flashing manner. At this time, the push buttons (C+, C−, F+, F−) can be operated to adjust the target voltage value. When the push buttons (C+, C−) are pressed simultaneously, the microcontroller 33 generates the display output in such a way that a person can see that the display 10 displays the maximum current value in a flashing manner. At this time, the push buttons (C+, C−, F+, F−) can be operated to adjust the maximum current value.

In view of the above, the switch mode power supply of this embodiment has the following advantages.

1. A gate drive transformer is not required. Therefore, the first PWM signal (PWM1) can have a relatively high transition frequency and would not be distorted, and the switch mode power supply can have relatively low power consumption and relatively high conversion efficiency.

2. Only two transformers (T1, T2) and only two controllers 33, 4 are required.

3. The converter output current with a magnitude in the order of μA to mA can be measured and displayed. Therefore, an ammeter that would cause a voltage drop is not required, and the magnitude of the converter output voltage can constantly be equal to the target voltage value.

4. The target voltage value and the maximum current value can be adjusted and stored. The maximum current value is used to prevent improper operation of the switch mode power supply.

5. By virtue of the first PWM controller 4 adjusting the duty cycle of the first PWM signal (PWM1) based on the ripple control time, the length of the ON time interval and the length of the OFF time interval, the magnitude of the ripple components of the converter output voltage can be reduced.

Referring to FIG. 6, a second embodiment of the switch mode power supply according to the disclosure is similar to the first embodiment, but differs from the first embodiment in what are described below.

In the second embodiment, the resistors (R9, R10, 54) and the opto-isolator (OK2) (see FIGS. 2 and 4) are omitted. The microcontroller 33 does not generate the indication signal. The photosensor 53 cooperates with a pull-up resistor (not shown) of the first PWM controller 4 to generate the actuation signal.

In addition, the voltage generator 91 includes a Zener diode (Dz), three capacitors (C3-C5), a resistor (R11), two rectifiers (REC1, REC2), a transformer (T2), a voltage regulator (VR1), a clamper 911 and a switch (Q10).

The transformer (T2) includes a first winding (T2P), a second winding (T2S1) and a third winding (T2S2). Each of the first to third windings (T2P, T2S1, T2S2) has a first terminal and a second terminal. The first terminal of the first winding (T2P) is to receive the external voltage (HV+). The second terminal of the first winding (T2P) is to receive the second PWM signal (PWM2). The second PWM signal (PWM2) causes the transformer (T2) to convert the external voltage (HV+) into a voltage across the second winding (T2S1) of the transformer (T2) and a voltage across the third winding (T2S2) of the transformer (T2).

The clamper 911 is coupled between the first and second terminals of the first winding (T2P) of the transformer (T2), and fixes a peak magnitude of a voltage at the second terminal of the first winding (T2P) of the transformer (T2) to a predetermined voltage value.

The rectifier (REC1) has two input terminals that are respectively coupled to the first and second terminals of the second winding (T2S1) of the transformer (T2), a first output terminal that is coupled to the first PWM controller 4, and a second output terminal that is coupled to ground. The rectifier (REC1) rectifies the voltage across the second winding (T2S1) of the transformer (T2) to generate the second operation voltage (Vcc) (e.g., 9V) at the first output terminal of the rectifier (REC1).

The capacitor (C3) is coupled between the first output terminal of the rectifier (REC1) and ground, and stabilizes the second operation voltage (Vcc).

The Zener diode (Dz) has a cathode that is coupled to the first output terminal of the rectifier (REC1), and an anode.

The resistor (R11) is coupled between the anode of the Zener diode (Dz) and ground.

The switch (Q10) (e.g., an nMOSFET) has a first terminal (e.g., a drain terminal), a second terminal (e.g., a source terminal) that is coupled to ground, and a control terminal (e.g., a gate terminal) that is coupled to the anode of the Zener diode (Dz).

The rectifier (REC2) has two input terminals that are respectively coupled to the first and second terminals of the third winding (T2S2) of the transformer (T2), a first output terminal, and a second output terminal that is coupled to ground. The rectifier (REC2) rectifies the voltage across the third winding (T2S2) of the transformer (T2) to generate a voltage (e.g., >7V) at the first output terminal of the rectifier (REC2).

The capacitor (C4) is coupled between the first output terminal of the rectifier (REC2) and ground, and stabilizes the voltage at the first output terminal of the rectifier (REC2).

The voltage regulator (VR1) is coupled between the first output terminal of the rectifier (REC2) and the output detector 3, and converts the voltage at the first output terminal of the rectifier (REC2) into the first operation voltage (VDD) (e.g., 5V) to power the output detector 3.

The capacitor (C5) is coupled between a common node of the voltage regulator (VR1) and the output detector 3 and ground, and stabilizes the first operation voltage (VDD).

The first PWM controller 4 does not generate the second PWM signal (PWM2). The switch mode power supply of this embodiment further includes a second PWM controller 8 that is independent of the first PWM controller 4. The second PWM controller 8 is coupled to the first terminal of the switch (Q10) and the second terminal of the first winding (T2P) of the transformer (T2), and generates the second PWM signal (PWM2) for receipt by the second terminal of the first winding (T2P) of the transformer (T2) based on a signal at the first terminal of the switch (Q10). A target magnitude (i.e., 9V) of the second operation voltage (Vcc) is determined by a breakdown voltage of the Zener diode (Dz), a resistance of the resistor (R10) and a threshold voltage of the switch (Q10). When the second operation voltage (Vcc) is smaller than 9V in magnitude, none of the Zener diode (Dz) and the switch (Q10) conducts, and the second PWM controller 8 alternates between pulling and not pulling the second PWM signal (PWM2) to a ground voltage. Otherwise, both of the Zener diode (Dz) and the switch (Q10) conduct, and the second PWM controller 8 does not pull the second PWM signal (PWM2) to the ground voltage. As a consequence, a magnitude of the second operation voltage (Vcc) is stabilized at 9V.

Moreover, the first PWM controller 4 does not receive the communication signal, does not obtain the ripple control time, and does not adjust the duty cycle of the first PWM signal (PWM1) based on the ripple control time, the length of the ON time interval and the length of the OFF time interval. It should be noted that, in this embodiment, the first PWM controller 4 may be a PWM controller of any type. The first PWM controller 4 should be a gallium nitride (GaN) dedicated PWM controller when the switch (Q1) is a GaN transistor. In view of the above, the switch mode power supply of this embodiment has the following advantages.

1. A gate drive transformer is not required. Therefore, the first PWM signal (PWM1) can have a relatively high transition frequency and would not be distorted, and the switch mode power supply can have relatively low power consumption and relatively high conversion efficiency.

2. Only two transformers (T1, T2) and only three controllers 33, 4, 8 are required.

3. The converter output current with a magnitude in the order of ||A to mA can be measured and displayed. Therefore, an ammeter that would cause a voltage drop is not required, and the magnitude of the converter output voltage can constantly be equal to the target voltage value.

4. The target voltage value and the maximum current value can be adjusted and stored. The maximum current value is used to prevent improper operation of the switch mode power supply.

In the description above, for the purposes of explanation, numerous specific details have been set forth in order to provide a thorough understanding of the embodiments. It will be apparent, however, to one skilled in the art, that one or more other embodiments may be practiced without some of these specific details. It should also be appreciated that reference throughout this specification to "one embodiment," "an embodiment," an embodiment with an indication of an ordinal number and so forth means that a particular feature, structure, or characteristic may be included in the practice of the disclosure. It should be further appreciated that in the description, various features are sometimes grouped together in a single embodiment, figure, or description thereof for the purpose of streamlining the disclosure and aiding in the understanding of various inventive aspects, and that one or more features or specific details from one embodiment may be practiced together with one or more features or specific details from another embodiment, where appropriate, in the practice of the disclosure.

While the disclosure has been described in connection with what are considered the exemplary embodiments, it is understood that the disclosure is not limited to the disclosed embodiments but is intended to cover various arrangements included within the spirit and scope of the broadest interpretation so as to encompass all such modifications and equivalent arrangements.

What is claimed is:

1. A switch mode power supply comprising:
   a first pulse width modulation (PWM) controller to receive an actuation signal, and generating a first PWM signal based on the actuation signal;
   a voltage converter having a first output terminal and a second output terminal, coupled to said first PWM controller to receive the first PWM signal, and to further receive an external voltage, wherein, based on the first PWM signal, said voltage converter converts the external voltage into a first output voltage, which is outputted at said first output terminal thereof, and a second output voltage, which is outputted at said second output terminal thereof;
   an output detector coupled to said first and second output terminals of said voltage converter to receive the first and second output voltages, and generating an enable signal based on a target voltage value and a magnitude difference between the first and second output voltages; and
   a communicator coupled to said output detector to receive the enable signal, further coupled to said first PWM controller, and generating the actuation signal, which corresponds to the enable signal, for receipt by said first PWM controller.

2. The switch mode power supply of claim 1, wherein said output detector includes:
   a voltage detection circuit coupled to said first output terminal of said voltage converter to receive the first output voltage, and generating a first detection signal that corresponds to the first output voltage;
   a current detection circuit coupled to said second output terminal of said voltage converter to receive the second output voltage, and generating a second detection signal that corresponds to the second output voltage; and
   a microcontroller coupled to said voltage detection circuit and said current detection circuit to receive the first and second detection signals, and further coupled to said communicator; said microcontroller obtaining the magnitude difference of the first and second output voltages based on the first and second detection signals, and generating the enable signal based on the target voltage value and the magnitude difference between the first and second output voltages.

3. The switch mode power supply of claim 2, wherein:
   said microcontroller further generates a resistance adjustment output;
   said voltage converter includes an adjustable resistive element that is coupled between said second output terminal of said voltage converter and ground, and that is further coupled to said microcontroller to receive the resistance adjustment output;
   said adjustable resistive element provides, between said second output terminal of said voltage converter and ground, a resistance that is dependent on the resistance adjustment output.

4. The switch mode power supply of claim 3, wherein:
   said adjustable resistive element includes a plurality of resistive units; and
   each of said resistive units includes a resistor and a switch that are coupled in series between said second output terminal of said voltage converter and ground.

5. The switch mode power supply of claim 3, further comprising a display coupled to said microcontroller, wherein:
   based on the first and second detection signals, said microcontroller generates a display output to control said display.

6. The switch mode power supply of claim 5, wherein:
   said display includes a plurality of display elements which are coupled to said microcontroller, and each of which is capable of displaying a respective base unit of electric current; and
   said microcontroller obtains, based on the second detection signal and the resistance adjustment output, a magnitude of a current flowing through said adjustable resistive element, and controls, based on the magnitude of the current flowing through said adjustable resistive element, each of said display elements to transition between displaying and not displaying the respective base unit of electric current.

7. The switch mode power supply of claim 2, wherein said current detection circuit includes:
- an amplifier having a non-inverting input terminal that is coupled to said second output terminal of said voltage converter to receive the second output voltage, an inverting input terminal, and an output terminal that is coupled to said microcontroller and that provides the second detection signal;
- a first resistor coupled between said inverting input terminal of said amplifier and ground; and
- a second resistor coupled between said inverting input terminal and said output terminal of said amplifier.

8. The switch mode power supply of claim 2, wherein said voltage detection circuit includes:
- a first resistor having a first terminal that is coupled to said first output terminal of said voltage converter to receive the first output voltage, and a second terminal;
- a second resistor and a first switch coupled in series between said second terminal of said first resistor and ground, said first switch being to receive a first switch control signal, and transitioning between conduction and non-conduction based on the first switch control signal;
- a third resistor and a second switch coupled in series between said second terminal of said first resistor and ground, said second switch being to receive a second switch control signal, and transitioning between conduction and non-conduction based on the second switch control signal; and
- an amplifier having a non-inverting input terminal that is coupled to said second terminal of said first resistor, an inverting input terminal, and an output terminal that is coupled to said inverting input terminal of said amplifier and said microcontroller and that provides the first detection signal.

9. The switch mode power supply of claim 1, wherein said communicator includes:
- a light emitting diode coupled to said output detector to receive the enable signal, and converting the enable signal into a light signal; and
- a photosensor coupled to said first PWM controller, and detecting the light signal to generate the actuation signal for receipt by said first PWM controller.

10. The switch mode power supply of claim 1, further comprising a discharger, wherein:
- said output detector further generates a discharge control signal; and
- said discharger is coupled to said first output terminal of said voltage converter, is further coupled to said output detector to receive the discharge control signal, and is operable, based on the discharge control signal, to reduce or not to reduce the magnitude difference between the first and second output voltages.

11. The switch mode power supply of claim 1, further comprising:
- a second PWM controller generating a second PWM signal; and
- a voltage generator coupled to said second PWM controller to receive the second PWM signal, to further receive the external voltage, and further coupled to said output detector and said first PWM controller; based on the second PWM signal, said voltage generator converting the external voltage into a first operation voltage, which is to power said output detector, and a second operation voltage, which is to power said first PWM controller.

12. The switch mode power supply of claim 1, wherein:
- the first PWM signal transitions between two different logic levels with a duty cycle in an ON time interval, and does not transition between the two different logic levels in an OFF time interval;
- said first PWM controller adjusts the duty cycle of the first PWM signal based on a ripple control time, a length of the ON time interval and a length of the OFF time interval;
- when the length of the ON time interval is longer than the ripple control time, said first PWM controller increases the duty cycle of the first PWM signal; and
- when the length of the OFF time interval is longer than a number (N) multiplied by the ripple control time, said first PWM controller decreases the duty cycle of the first PWM signal, where N>1.

13. The switch mode power supply of claim 1, further comprising:
- a voltage generator to receive the external voltage and a second PWM signal, and further coupled to said output detector and said first PWM controller; based on the second PWM signal, said voltage generator converting the external voltage into a first operation voltage, which is to power said output detector, and a second operation voltage, which is to power said first PWM controller;
- wherein said first PWM controller is further coupled to said voltage generator, and generates the second PWM signal for receipt by said voltage generator.

* * * * *